(12) United States Patent
Lin et al.

(10) Patent No.: US 6,311,766 B1
(45) Date of Patent: Nov. 6, 2001

(54) HEAT SINK ASSEMBLY

(75) Inventors: Mark Lin; Carey Lai, both of Tu-Chen (TW); Hans Wan, Shenzhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/749,124

(22) Filed: Dec. 26, 2000

(30) Foreign Application Priority Data

Oct. 6, 2000 (TW) .............................................. 089217336

(51) Int. Cl.$^7$ ....................................................... H05K 7/20
(52) U.S. Cl. ........................... 165/80.3; 165/121; 361/697
(58) Field of Search ................................... 165/80.3, 185, 165/121; 361/695, 696, 697, 704

(56) References Cited

U.S. PATENT DOCUMENTS

| | | | |
|---|---|---|---|
| 5,590,025 | * 12/1996 | Clemens | 361/695 |
| 6,017,185 | * 1/2000 | Kuo | 415/177 |
| 6,118,657 | * 9/2000 | Clemens | 361/697 |

* cited by examiner

Primary Examiner—Allen Flanigan
(74) Attorney, Agent, or Firm—Wei Te Chung

(57) ABSTRACT

A heat sink assembly includes a heat sink (50), a fan (10), and a fixing device (30). The heat sink has a chassis (56) which defines a pair of diagonally opposite grooves (58) in respective opposite side walls thereof. The fan defines a vertical through hole (12) at each corner. The fixing device has a rectangular base (35). A pole (32) having a barb (36) extends upwardly from each corner of the base, for engaging with the corresponding through hole. A pair of legs (40) depends from each side of the base. A catch (42) is formed at a distal end of each leg, for engaging with the heat sink. Two guard boards (46) depend from each side of the base. A pair of bosses (48) is formed at distal ends of two diagonally opposite guard boards, for engaging with the grooves of the heat sink.

8 Claims, 3 Drawing Sheets

HEAT SINK ASSEMBLY

BACKGROUND

1. Field of the Invention

The present invention relates to a heat sink assembly, and particularly to a heat sink assembly having a fixing device for readily and firmly attaching a fan to a heat sink.

2. Related Art

Developments in today's highly information-intensive society have led to remarkable improvements in performances of electronic devices. During operation of many contemporary electronic devices, large amounts of heat are produced. Such heat must be quickly removed from the electronic device, to prevent the system from becoming unstable or being damaged. Typically, a heat sink is attached to an outer surface of the device to facilitate removal of heat therefrom. Fans are often attached to the heat sink to provide forced convection therefrom.

Taiwan Patents Nos. 331947, 319404, and 255511 disclose various heat sink assemblies which include fans. In Taiwan Patent No. 331947, a conventional heat sink assembly comprises a fixing device to attach fins to a heat dissipating base. A fan is mounted on a top surface of the fixing device with screws. A pair of legs depends from respective opposite sides of the fixing device. The legs define catches at distal ends thereof, to engage with apertures in side walls of the base. However, securing the fan to the fixing device with screws is cumbersome and time-consuming. Furthermore, the fixing device is attached to the base by means of just two catches engaging with two apertures. This leaves the assembly prone to dislodgement when subjected to shock or vibration during normal operation.

Taiwan Patent No. 319404 comprises a pair of U-shaped fixing tabs respectively attaching two concertinaed fins on a heat dissipating base. A fan is then mounted on the fixing tabs using screws, which is unduly cumbersome. Moreover, the structure is unduly complicated because it contains many components.

Taiwan Patent No. 255511 comprises at least four fixing members to assemble a fan, a heat sink and a microprocessor together. The four fixing members must be installed one by one. Although it does not require screws, the installation process is unduly lengthy and complicated.

An improved means of securing a fan to a heat sink, which overcomes the above problems, is desired.

SUMMARY OF THE INVENTION

Accordingly, an object of the present invention is to provide a heat sink assembly having a fixing device which firmly and reliably attaches a fan to a heat sink.

Another object of the present invention is to provide a heat sink assembly which is readily assembled and disassembled.

To achieve the above-mentioned objects, a heat sink assembly comprises a heat sink, a fan and a fixing device. The heat sink has a chassis which defines a pair of diagonally opposite grooves in respective opposite side walls thereof. The fan defines a vertical through hole at each corner thereof. The fixing device has a rectangular base. A pole having a barb extends upwardly from each corner of the base, for engaging with the corresponding through hole of the fan. A pair of legs depends from respective opposite ends of each side of the base. A catch is formed at a distal end of each leg, for engaging with the heat sink. Two guard boards depend from respective opposite ends of each side of the base, adjacent to and integral with respective legs. A pair of bosses is formed at distal ends of two diagonally opposite guard boards on respective opposite sides of the base, for engaging with the grooves of the heat sink.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
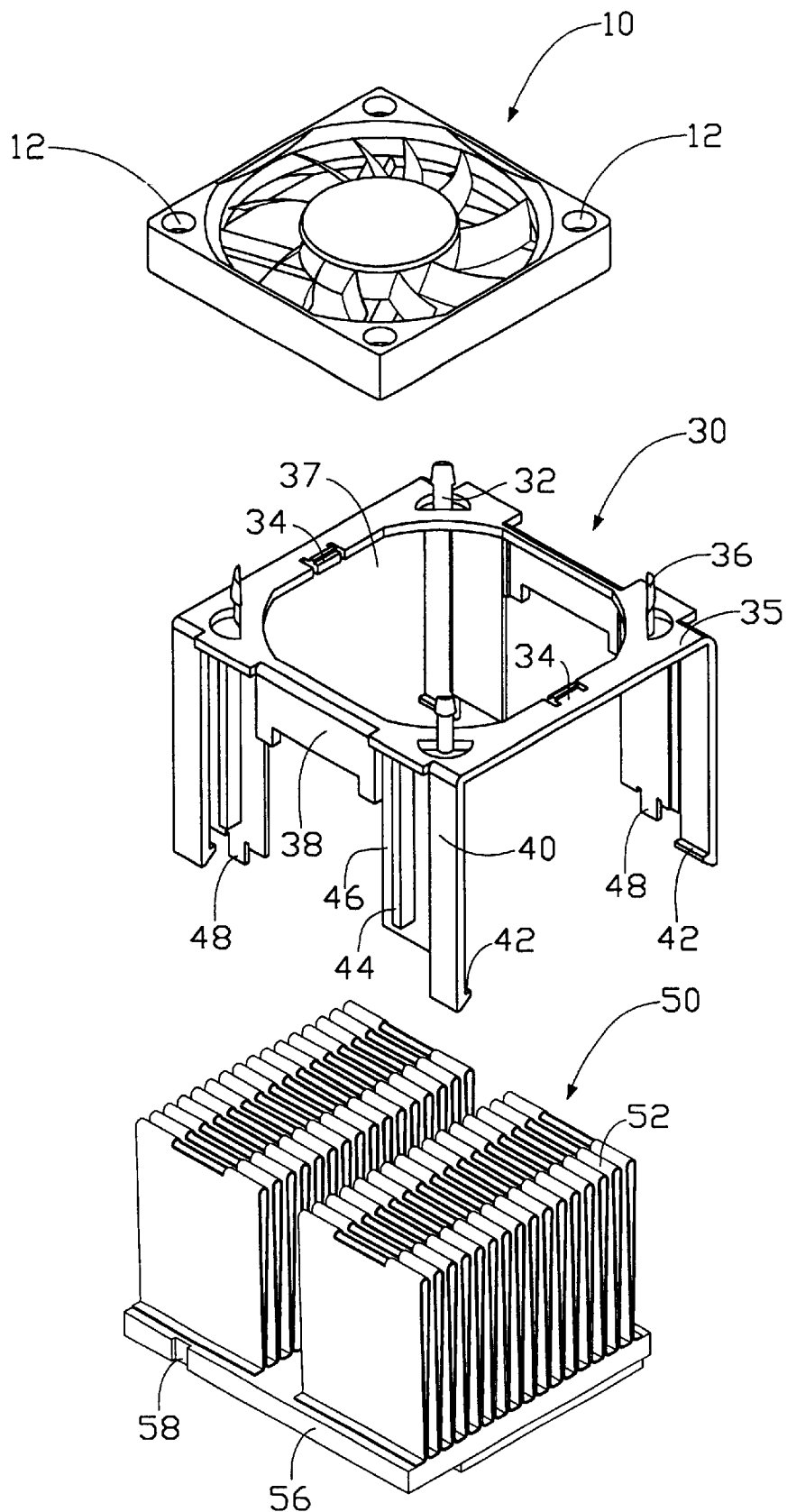
FIG. 1 is an exploded view of a heat sink assembly in accordance with the present invention.

Referring to FIG. 1, a heat sink assembly in accordance with the present invention comprises a fan 10, a heat sink 50, and a fixing device 30 which attaches the fan 10 to the heat sink 50. The fan 10 is box-shaped, and defines a vertical through hole 12 at each corner thereof. The heat sink 50 has a chassis 56, and a plurality of concertinaed fins 52 extending upwardly from the chassis 56. The chassis 56 is made from a copper plate, and defines a pair of diagonally opposite grooves 58 (only one visible) in respective opposite side walls thereof.

Figure 2:
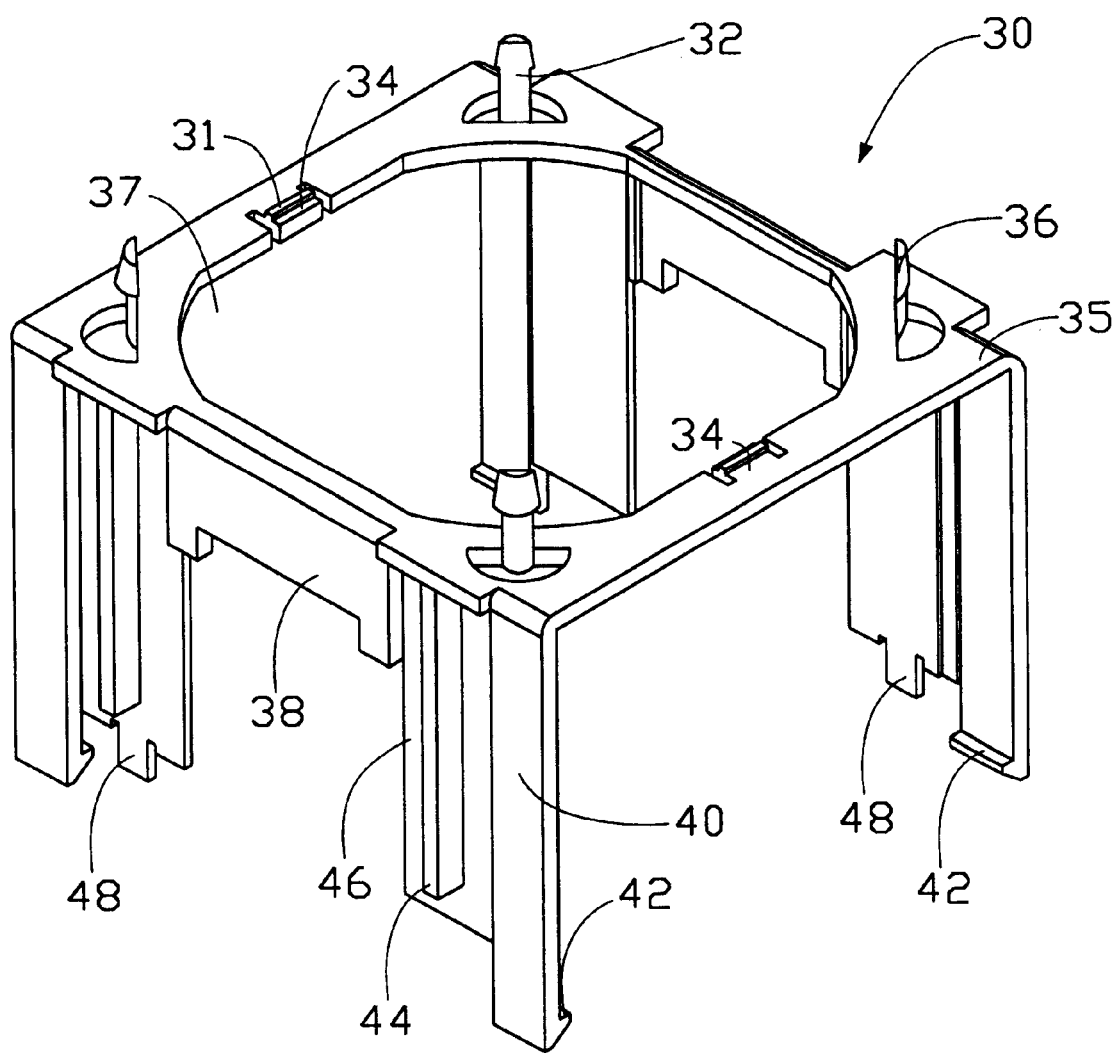
FIG. 2 is a perspective view of a fixing device of FIG. 1.

Referring also to FIG. 2, the fixing device 30 has a rectangular base 35. A large opening 37 is defined in the center of the base 35, for providing airflow access for the fan 10. Four poles 32 extend upwardly from four respective corners of the base 35. Each pole 32 forms a barb 36 at a distal end thereof A pair of elastically deformable spring tabs 34 is formed at respective opposite sides of the base 35, adjacent the opening 37. An upper surface of each spring tab 34 is slightly inclined, such that the upper surface adjacent the opening 37 is higher than the upper surface where the spring tab 34 joins the base 35. A positioning protrusion 31 extends upwardly from each spring tab 34. A pair of legs 40 depends from opposite ends of each side of the base 35. An internal catch 42 is defined at a distal end of each leg 40. A pair of guard boards 46 depends from opposite ends of each side of the base 35. The guard boards 46 are adjacent to and integral with adjoining edges of respective legs 40, but are offset slightly such that two guard boards 46 on respective opposite sides of the base 35 are closer to each other than two legs 40 on respective opposite sides of the base 35. Each guard board 46 has an external reinforcing rib 44 formed thereon. A boss 48 depends from one guard board 46 on each side of the base 35. The bosses 48 are diagonally opposite each other, and correspond to the grooves 58 of the heat sink 56. A U-shaped connecting tab 38 depends from a central portion of each side of the base 35. Each connecting tab 38 is adjacent to and integral with respective adjoining edges of two guard boards 46, but is offset slightly such that the connecting tabs 38 on respective opposite sides of the base 35 are farther away from each other than two opposing guard boards 46 on respective opposite sides of the base 35.

Figure 3:
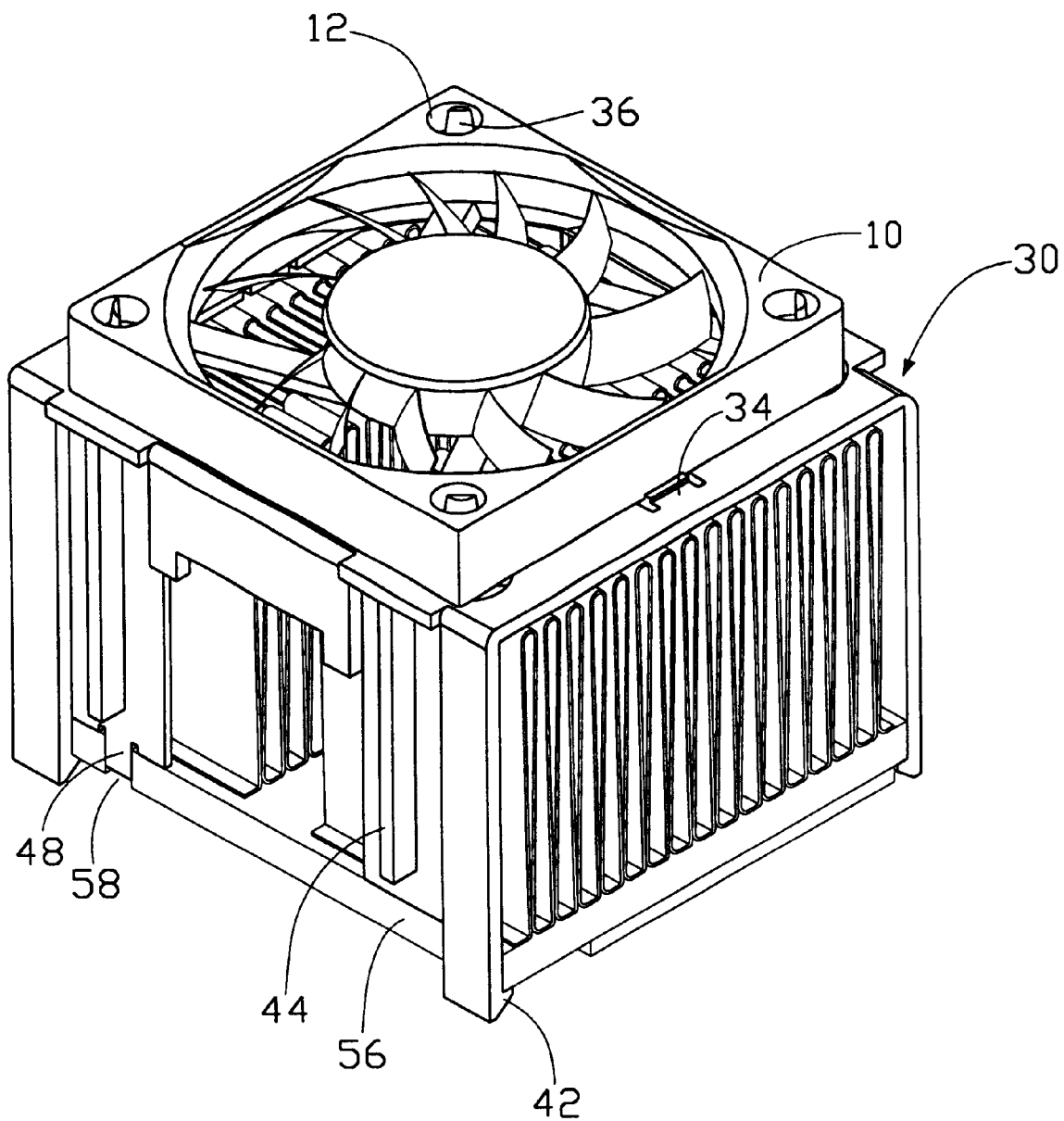
FIG. 3 is an assembled view of FIG. 1.

Referring to FIG. 3, in assembly, the fan 10 is placed on the fixing device 30. The poles 32 of the fixing device 30 extend into the through holes 12 of the fan 10. The positioning protrusions 31 of the fixing device 30 abut respective opposite side walls of the fan 10. Thus the fan is attached to the fixing device 30. Then the bosses 48 of the fixing device 30 are inserted into the grooves 58 of the heat sink 50. The catches 42 of the legs 40 of the fixing device 30 engage with a bottom surface of the chassis 56 of the heat sink 50. Thus the fixing device 30 firmly attaches the fan 10 to the heat sink 50.

The heat sink assembly of the present invention includes the following advantages:

1. The fan 10 is attached to the fixing device 30 by the poles 32 being inserted into the through holes 12. The fixing device 30 is attached to the heat sink 50 by the catches 42 of the fixing device 30 engaging with the chassis 56 of the heat sink 50. Thus the whole assembly process is quick and convenient.

2. The spring tabs 34 and the positioning protrusions 31 of the fixing device 30 cooperate to enlarge fit tolerance between the fan 10 and the fixing device 30.

3. The engagement between the catches 42 of the fixing device 30 and the bottom surface of the heat sink 50 makes the use of screws unnecessary.

4. The bosses 48 of the fixing device 30 are inserted into the grooves 58 of the heat sink 50. This prevents the fixing device 30 from moving in a lateral direction relative to the heat sink 50.

It is understood that the invention may be embodied in other forms without departing from the spirit thereof. Thus, the present example and embodiment are to be considered in all respects illustrative and not restrictive, and the invention is not to be limited to the details given herein.

What is claimed is:

1. A heat sink assembly comprising:
   a heat sink having a chassis and a plurality of fins extending from the chassis, at least one groove being defined in at least one side wall of the chassis;
   a fan; and
   a fixing device connected between the heat sink and the fan, the fixing device comprising a base defining an opening therethrough to provide air flow access for the fan, at least two legs depending from the base for engaging with the heat sink, and at least one boss for engaging with the at least one groove of the heat sink.

2. The heat sink assembly as described in claim 1, wherein a pair of spring tabs is formed in the base of the fixing device at respective opposite sides of the opening, each tab forming a positioning protrusion thereon, for enlarging fit tolerance between the fan and the fixing device.

3. The heat sink assembly as described in claim 1, wherein at least one pole extends upwardly from the base, each pole forming a barb thereon, and wherein the fan defines at least one through hole for receiving the at least one pole, thereby securing the fan to the base.

4. The heat sink assembly as described in claim 1, wherein the fixing device has at least one guard board depending from the base.

5. The heat sink assembly as described in claim 4, wherein a reinforcing rib is formed on each guard board.

6. The heat sink assembly as described in claim 1, wherein at least one connecting tab depends from the base, for reinforcing the structure of the fixing device.

7. The heat sink assembly as described in claim 6, wherein each connecting tab is U-shaped.

8. A heat sink assembly comprising:
   a heat sink having a chassis and a plurality of fins extending upwardly from said chassis;
   a fan; and
   a fixing device connected between said heat sink and said fan, said fixing device including a base defining an opening therethrough to provide air flow access for the fan, at least a leg downwardly extending from the base to latchably engage the chassis, and at least a pole upwardly extending from said base to latchably engage the fan; and
   means for preventing lateral movement of the fixing device relative to said heat sink, wherein said means includes a groove defined in the chassis, and a boss extending from a guiding board of said fixing device adjacent to the corresponding leg.

* * * * *